United States Patent [19]
Cronin

[11] Patent Number: 5,746,621
[45] Date of Patent: May 5, 1998

[54] ELECTROSTATIC DISCHARGE PROTECTION DEVICE

[75] Inventor: David V. Cronin, Peabody, Mass.

[73] Assignee: Polaroid Corporation, Cambridge, Mass.

[21] Appl. No.: 664,147

[22] Filed: Jun. 14, 1996

Related U.S. Application Data

[62] Division of Ser. No. 278,063, Jul. 20, 1994, Pat. No. 5,599,205.

[51] Int. Cl.$^6$ .................................................. H01R 13/703
[52] U.S. Cl. ........................... 439/507; 439/161; 439/511; 361/212
[58] Field of Search ................................. 439/507, 509, 439/511, 512, 513, 514, 161; 361/212, 220

[56] References Cited

U.S. PATENT DOCUMENTS

| | | | |
|---|---|---|---|
| 3,467,940 | 9/1969 | Wallo | 339/14 |
| 3,653,498 | 4/1972 | Kisor | 206/46 H |
| 3,774,075 | 11/1973 | Medesha | 317/2 R |
| 4,019,094 | 4/1977 | Dinger et al. | 361/220 |
| 4,617,605 | 10/1986 | Obrecht et al. | 361/220 |
| 4,971,568 | 11/1990 | Cronin | 439/188 |
| 5,108,299 | 4/1992 | Cronin | 439/188 |
| 5,163,850 | 11/1992 | Cronin | 439/507 |
| 5,164,880 | 11/1992 | Cronin | 361/220 |
| 5,259,777 | 11/1993 | Schuder et al. | 439/188 |
| 5,289,336 | 2/1994 | Gagliano | 361/220 |
| 5,562,489 | 10/1996 | Cronin | 439/507 |

FOREIGN PATENT DOCUMENTS

| | | |
|---|---|---|
| 2348630 | 3/1975 | Germany. |
| 0071031 | 9/1983 | Germany. |
| 59-13353 | 1/1984 | Japan. |
| 61-148852 | 11/1986 | Japan. |
| 62-276855 | 1/1987 | Japan. |

OTHER PUBLICATIONS

Middlebrook, Carlton G., "Electrical Shorting Cap," *Navy Technical Disclosure Bulletin*, vol. 6, No. 3, Mar. 1981, pp. 33–36 (Navy Technology Catalog No. 5260 1530, Navy Case No. 63818).

Wang, Shay-Ping T., and Ogden, Paul, "Membrane-Type Pin Protector for Pin Grid Array Devices," 1991 IEEE/SEMI Advanced Semiconductor Manufacturing Conference, pp. 120–127.

*Primary Examiner*—Gary F. Paumen
*Assistant Examiner*—T. C. Patel
*Attorney, Agent, or Firm*—Christopher P. Ricci; Joseph Stecewycz; Wolfgang E. Stutius

[57] ABSTRACT

A plurality of electrostatic discharge protection devices are disclosed for use with semiconductor chip packages of a type having a top surface, a bottom surface, and disposed between the top surface and the bottom surface a plurality of lateral surface with extending therefrom a plurality of connector pins disposed thereon. The electrostatic discharge protection devices disclosed herein are heat sensitive in that they automatically withdraw from electrical contact with the connecting pins upon introduction of sufficient heat such as that of soldering. In addition, disclosed herein is a electrostatic discharge protection device for manual withdrawal should the electrostatic discharge protection be required after the soldering process has been terminated.

8 Claims, 21 Drawing Sheets

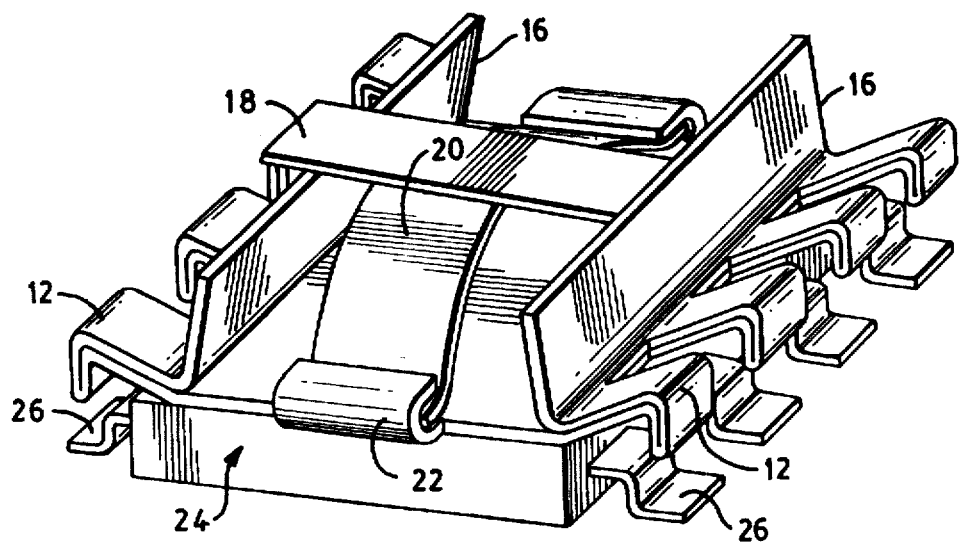
FIG. IC

ELECTROSTATIC DISCHARGE PROTECTION DEVICE

This application is a division of application Ser. No. 8/278,063, filed Jul. 20, 1994, now U.S. Pat. No. 5,599,205.

BACKGROUND OF THE INVENTION

The present invention relates generally to electrostatic discharge protection devices. More particularly, the invention relates to electrostatic discharge protection devices for semiconductor chip packages ("SCP") where the electrostatic discharge protection device connects pins on the SCP to inhibit electrostatic charge accumulation, and disconnects the ground connection upon operative combination of the SCP on the circuit board, or, optionally, disconnection can be a manual operation.

Electrostatic charge is a stationary electric charge which accumulates on various surfaces. An electrostatic discharge occurs when the electrostatic charge becomes substantial enough to overcome a dielectric material between the charge and another surface of lower electrical potential. An example of such a discharge as naturally occurring is lightning.

Electrostatic discharge in the realm of electronics can be devastating to microelectronic devices. A sharp voltage spike caused by an electrostatic discharge can cause permanent and costly damage to individual precision devices, such as random access memory or other semiconductor devices, inter alia.

Many commercially available electrostatic discharge protection devices in use today consist primarily of electrostatic discharge packaging of the SCP in electrically conductive strips, pellets, boxes, and plastic tubing which provide effective electrostatic discharge protection until the user is about to insert the SCP onto the circuit board. At that point the user must remove the electrostatic discharge packaging from the SCP thus rendering the SCP vulnerable to electrostatic discharge in order to position and insert the connector pins onto the circuit board. Accordingly, as the user inserts the connector pins of the SCP into the receptacles, the semiconductor dies housed within the SCPs could be destroyed by electrostatic discharge and the SCP would therefore have to be replaced.

In some instances, where the receptacle itself is electrostatically charged, it is advantageous to allow the electrostatic discharge protection device to remain in place and be removed manually.

Surface mount microelectronic devices have an additional problem in that they often have numerous small pins, often on all four sides of the SCP, thereby making the surface mount device difficult to handle. A prior art electrical connector receptacle arrangement is described in commonly assigned U.S. Pat. No. 5,108,299 entitled "Electrostatic Discharge Protection Devices for Semiconductor Chip Packages" by David V. Cronin issued Apr. 28, 1992. This patent shows a shunt attachment placed on pins of the semiconductor chip package arranged to provide a short circuit across selected pins. Upon insertion into the receptor, the attachment is driven away from the semiconductor chip package, causing the short circuit to be broken. While this arrangement is an improvement and is useful for connectors for semiconductor chip packages such as Dual In-line Packages, DIPs, the design requires that they be fairly large and clip to the semiconductor chip package which in the case of surface mount or other chips having pins on all four sides or numerous small pins, can become unwieldy.

Other commonly assigned patents and copending applications include U.S. Pat. No. 4,971,568 entitled "Electrical Connector With Attachment For Automatically Shorting Select Conductors Upon Disconnection of Connector" by David V. Cronin issued Nov. 20, 1990, U.S. Pat. No. 5,163,850 entitled Electrostatic Discharge Protection Devices For Semiconductor Chip Packages" by David V. Cronin issued Nov. 17, 1992, U.S. Pat. No. 5,164,880 entitled "Electrostatic Discharge Protection Device for a Printed Circuit Board" by David V. Cronin issued Nov. 17, 1992, and pending U.S. Application Ser. No. 234,917 entitled "Electrostatic Discharge Protection Device" by David V. Cronin filed Apr. 28, 1994.

In addition, the prior art electrostatic discharge protection devices often need downward pressure to release a ground connection, and upon release, the electrostatic discharge protection device causes a bias of the SCP away from its receptacle. While this is not a significant limitation if there is enough resistive or tractive force to hold the SCP in this position, this limitation, in the case of surface mount, does force the use of an adhesive to secure the SCP before soldering.

In the case of surface mount microelectronic devices, or other SCPs which have large quantities of connector pins, additional problems arise in the difficulty of manufacturing the prior art electrostatic discharge protection devices and a loss of rigidity of the electrostatic discharge protection devices over a long, span. With respect to the latter, if the electrostatic discharge protection device has only two points of contact for a row of connecting arms, one on each end, a long span causes the middle of the row to lag the outer parts of the row when pulling away due to flex in the structure over the long span.

Accordingly, it is an object of this invention to provide electrostatic discharge protection devices which operate to automatically open a short between selected conductors upon connection with a mating receptacle or is adapted to manually open the short circuit if the mating receptacle is also subject to electrostatic discharge.

It is another object of this invention to provide electrostatic discharge protection devices that do not bias the SCP away from its receptacle.

It is still another object of the invention to provide an electrostatic discharge protection device which is easier and, therefore, less costly to manufacture.

These and other objects of the invention will be obvious and will appear hereinafter.

SUMMARY OF THE INVENTION

The aforementioned and other objects are achieved by the invention which provides, in one aspect, an electrostatic discharge protection device. The electrostatic discharge protection device is useful with semiconductor chip packages having numerous pin conductors on which the electrostatic discharge protection device operates to automatically short the pin conductors together while the SCP is disconnected from a host receptor.

An electrostatic discharge protection device is disclosed which grounds electrostatic discharge on a semiconductor chip package to protect internal circuitry of the semiconductor chip package. The electrostatic discharge protection device can be used with any semiconductor chip package of a type having a top surface and an opposite bottom surface and a plurality of lateral surfaces integral with said top and bottom surfaces. The two or more of said lateral surfaces have extending therefrom a plurality of connector pins disposed in a spaced apart relationship with respect to each other. The electrostatic discharge protection device comprises a base section, grounding means and actuation means.

The base section is secured to said semiconductor chip package by adhesive, clips, or other means commonly known in the art.

The grounding means extends from the base section. The grounding means has an operative position for connecting a shunt across the plurality of connector pins thereby establishing connection to electrical ground for the connector pins. The grounding means also has an inoperative position for disconnecting the aforementioned shunt to reestablish electrical isolation between the plurality of connector pins.

The actuation means moves the grounding means between the operative and inoperative positions. This is accomplished by manually removing the grounding means or by automatic operation in response to a predetermined temperature causing the actuation means to move to the inoperative position. An example of an introduction of the predetermined temperature is soldering the semiconductor chip package to a circuit board.

In further aspects the invention provides methods in accord with the apparatus described above, the aforementioned and other objects of the invention are evident in the drawings and in the description that follows.

BRIEF DESCRIPTION OF THE DRAWINGS

The foregoing and other objects of the invention the various features thereof as well as the invention itself may be more fully understood from the following description when read together with the accompanying drawings in which:

FIG. 1C is a perspective view of an electrostatic discharge protection device-SCP sub-assembly shown in FIG. 1B illustrated in a disconnected position;

DETAILED DESCRIPTION

While the present invention retains utility within a wide variety of electronic devices and may be embodied in several different forms, it is advantageously employed in connection with a semiconductor chip package. Though this is the form of the preferred embodiment and will be described as such, the embodiment should be considered as illustrative and not restrictive.

Figure 1A:
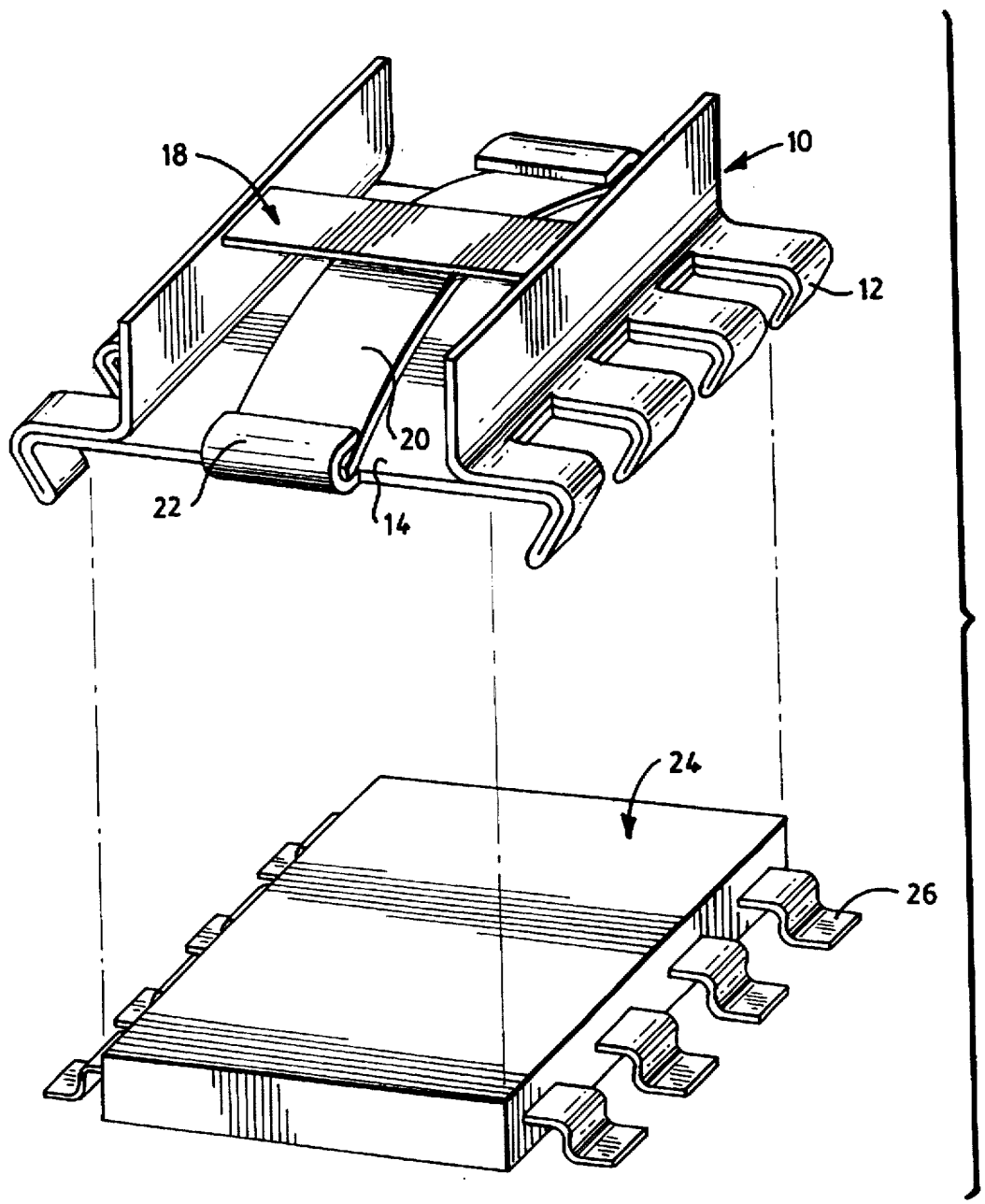
FIG. 1A is an exploded perspective view of an electrostatic discharge protection device of this invention disposed above a SCP.
Figure 1B:
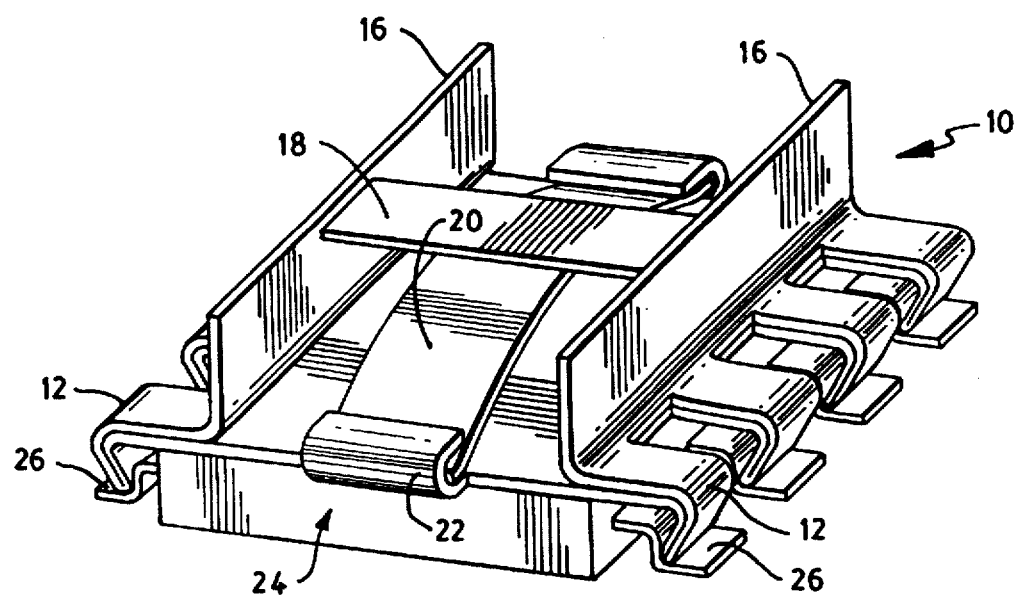
FIG. 1B is a perspective view of the electrostatic discharge protection device shown in FIG. 1A mated to the top surface of the SCP also shown in FIG. 1A.

Referring now to FIGS. 1A–1C, there is shown generally a SCP-electrostatic discharge protection device combination comprising an electrostatic discharge protection device 10 of this invention and an SCP 24.

The SCP in one embodiment comprises a top surface, a bottom surface and, between the top and bottom surfaces, interconnecting surfaces. A plurality of connector pins 26 are disposed on each interconnecting surface in a substantially parallel and spaced apart relationship with respect to each other.

The plurality of connector pins 26 are adapted for physical and electrical connection to a connector, typically a printed circuit board, having a substantially planar surface on one selected side thereof.

In order to ensure that the connector pins 26 are shorted until they are soldered into the complementary receptacles, on a printed circuit board for example, the electrostatic discharge protection device 10 is provided. The electrostatic discharge protection device 10 comprises a base section 14 which is secured to a surface of the SCP 24 and a plurality of integral shorting arms 12 which extend outwardly from the base section 14 with their distal end portions in spaced apart relationship with respect to each other and transversely disposed with respect to the connector pins 26. Each shorting arm 12 extends downward from a bend in the shorting arm 12 to connect with individual connector pins 26. An adhesive (not shown) disposed on the base section 14 or a set of clips (not shown) disposed on the ends of the base section 14 provide the electrostatic discharge protection device 10 with a secure attachment to the SCP 24.

The plurality of shorting arms 12 are yieldably biased by any means well known in the art such as built in resilient spring bias so as to urge their respective distal end portions against the plurality of connector pins 26 thereby creating an electrical interconnection between the plurality of shorting arms 12 and the plurality of connector pins 26. Thus it is readily apparent from FIGS. 1A–1C that when the plurality of shorting arms 12 are engaged with the connector pins 26, the shorting arms 12 urge their respective distal end portions against and into electrical connection with the plurality of connector pins 26. In this manner the shorting of all or some of the connector pins 26 is accomplished so as to effectively protect the semiconductor die (not shown) within the SCP 24 from electrostatic discharge which could operate to damage the electrical circuitry in the semiconductor die.

The electrostatic discharge protection device is fabricated from conductive material to allow electrical conduction throughout the device. The materials can be a plastic doped with a conductive element such as carbon, a plastic with a conductive outer cladding or various other materials. In the preferred embodiment, the electrostatic discharge protection device is fabricated entirely from Beryllium Copper which is a conductive metal alloy with a high spring constant.

In the preferred embodiment, the shorting arm that is actually connected to ground has a higher resistance than the other shorting arms. This is done so that electrostatic discharge, if present, drains slowly to ground, thus preventing high speed, harmful, induced internal transient currents. This is accomplished, in the preferred embodiment, by coating a contact surface of the ground shorting arm with a thin resistive coating, thus increasing electrical resistance.

After insertion of the connector pins 26 into complementary receptacles on the printed circuit board, the next step in the attaching process of the SCP 24 is to solder the SCP 24 into place. During the soldering process, the electrostatic discharge protection device 10 automatically withdraws the short circuit connection across the connector pins 26 to create electrical isolation between the connector pins 26. In the case that soldering did not generate sufficient heat to cause the electrostatic discharge protection device to disconnect, heat from a heat gun is used to supplement thereby completing the withdrawal of the shorting arms 12 from contact with the connector pins 26.

In this embodiment, the automatic withdrawal of the short circuit is accomplished by utilizing a heat sensitive metal band 20 which bulges vertically from the base section 14 into contact with a bar 18. The metal band 20 is held into position by clips 22 on each end.

In the normally connected position, the bar holds horizontal extensions 16 which are extending upward from the base section 14 apart as the horizontal extensions 16 are fabricated to have an inward bias for urging the shorting arms 12 away from the connector pins 26.

As the soldering process proceeds, the heat generated by the soldering process often exceeds 600° Fahrenheit. This heat activates the heat sensitive metal of the metal band 20 causing it to bulge farther outward away from the base section 14. This bulging action forces the bar 18 away from the base section 14 such that one end of the bar goes above one of the horizontal extensions 16 thereby allowing the horizontal extensions to propel themselves inward due to the inward bias, thereby disengaging the shorting arms 12 from mechanical contact with the connector pins 26.

In this embodiment, the heat sensitive metal band is fabricated from a bimetallic laminate of two metals having substantially different coefficients of thermal expansion. In the preferred embodiment the heat sensitive metal band is made of an alloy of copper and steel.

Figure 2A:
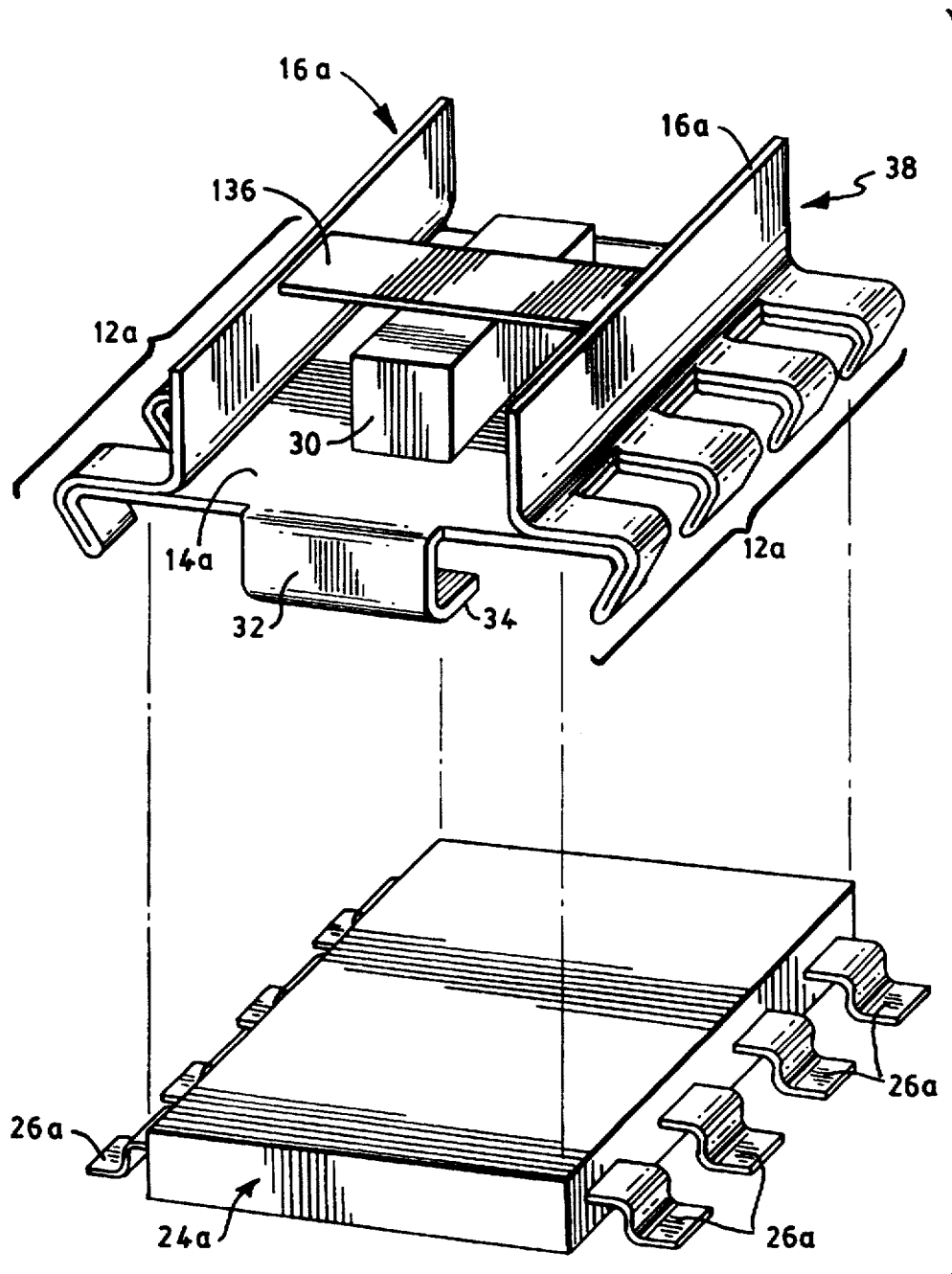
FIG. 2A is an exploded perspective view of an electrostatic discharge protection device of this invention disposed above a SCP.
Figure 2B:
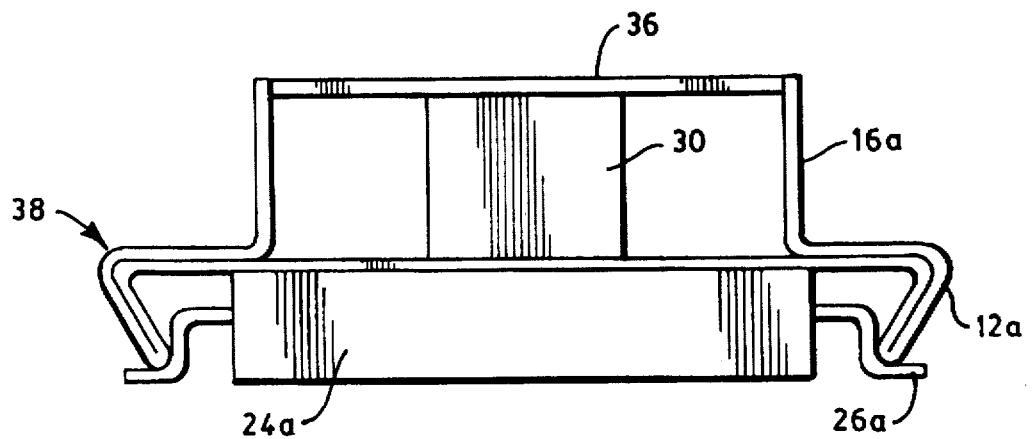
FIG. 2B is a perspective view of the electrostatic discharge protection device shown in FIG. 2A mated to the top surface of the SCP also shown in FIG. 2A.
Figure 2C:
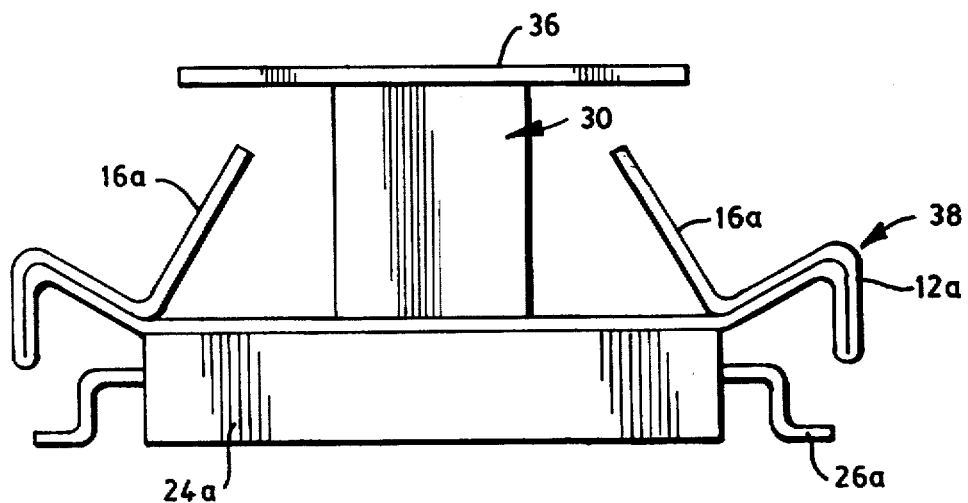
FIG. 2C is a perspective view of an electrostatic discharge protection device-SCP sub-assembly shown in FIG. 2B illustrated in a disconnected position.
Figure 3A:
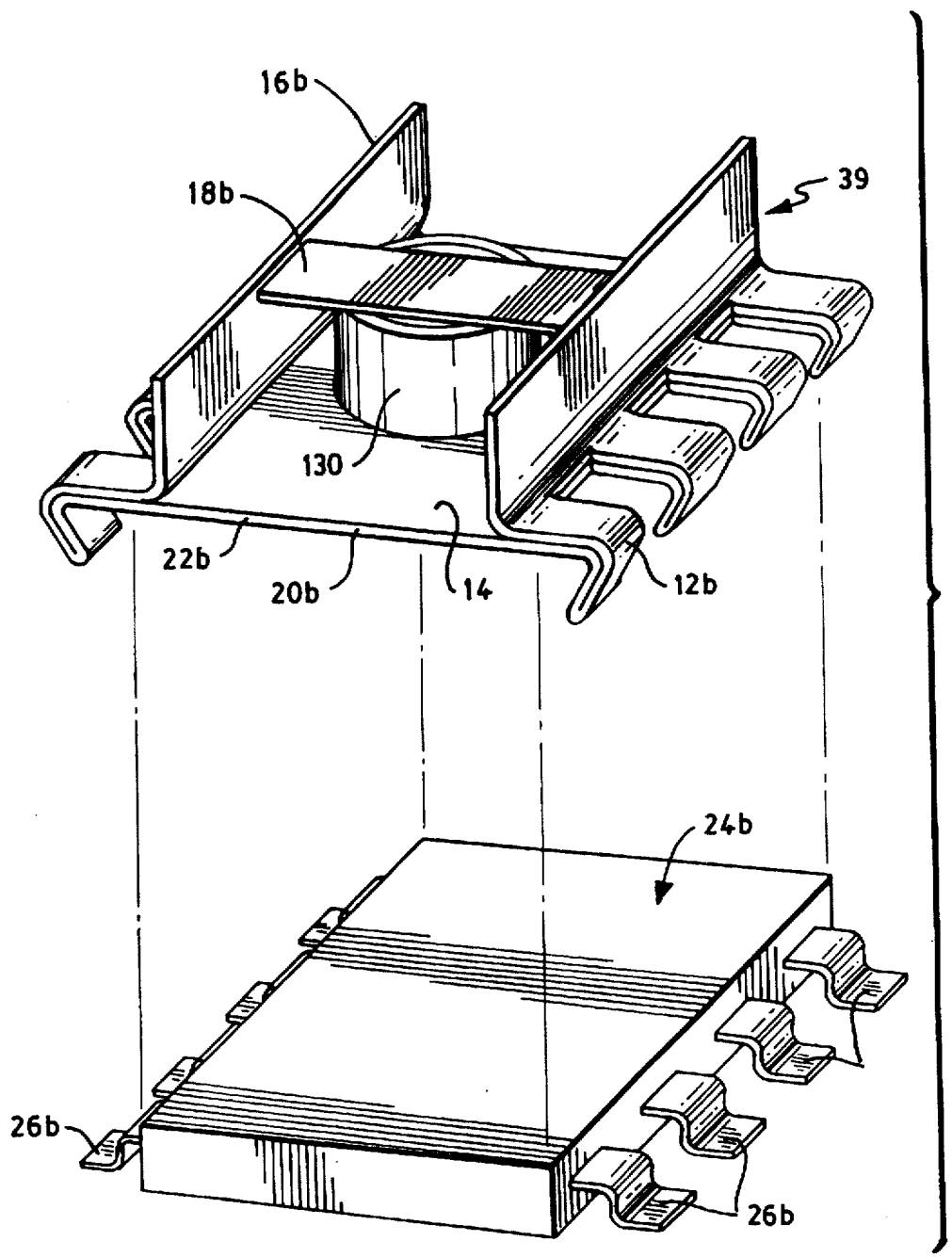
FIG. 3A is an exploded perspective view of an electrostatic discharge protection device of this invention disposed above a SCP.
Figure 3B:
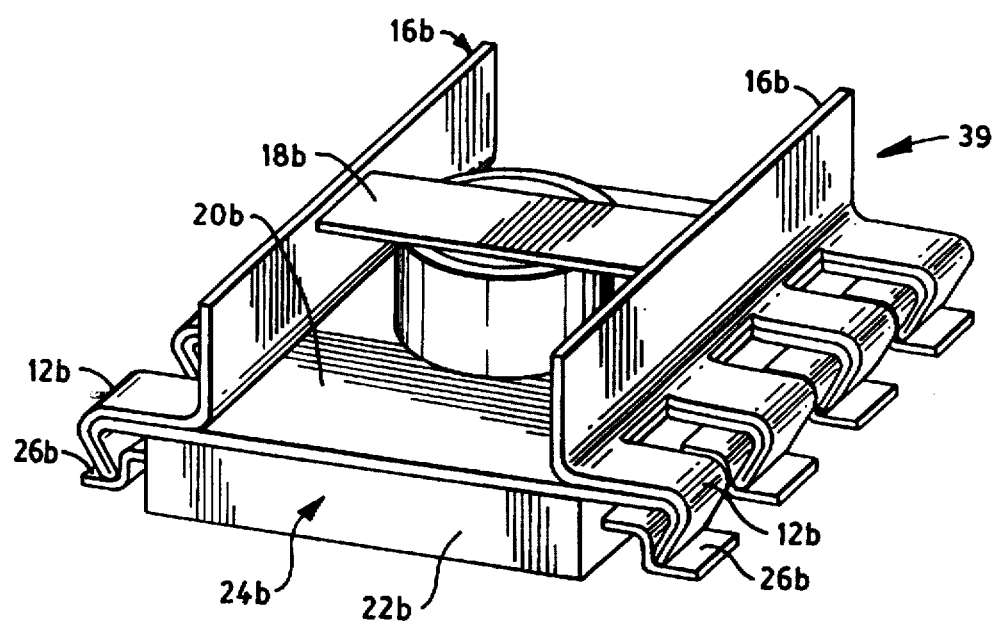
FIG. 3B is a perspective view of the electrostatic discharge protection device shown in FIG. 3A mated to the top surface of the SCP also shown in FIG. 3A.
Figure 3C:
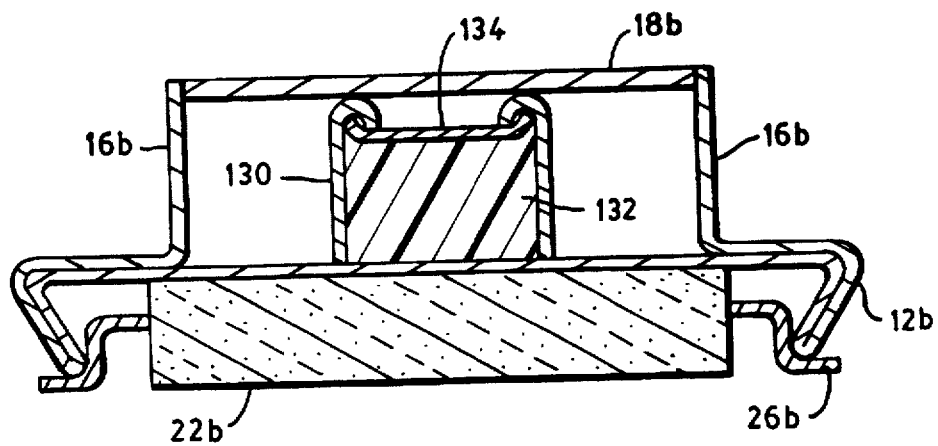
FIG. 3C is a cross-sectional view of the electrostatic discharge protection device shown in FIG. 3A in a normally closed position.
Figure 3D:
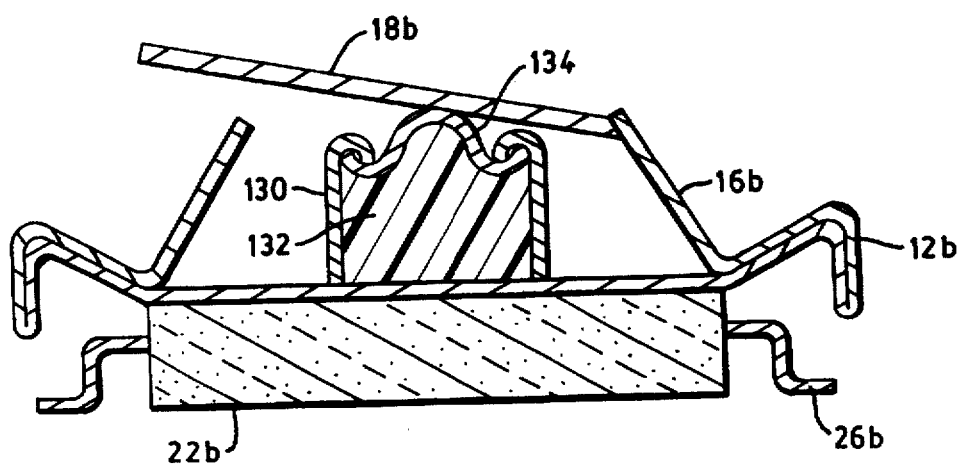
FIG. 3D is a cross-sectional view of the electrostatic discharge protection device shown in FIG. 3A in an open position.
Figure 3E:
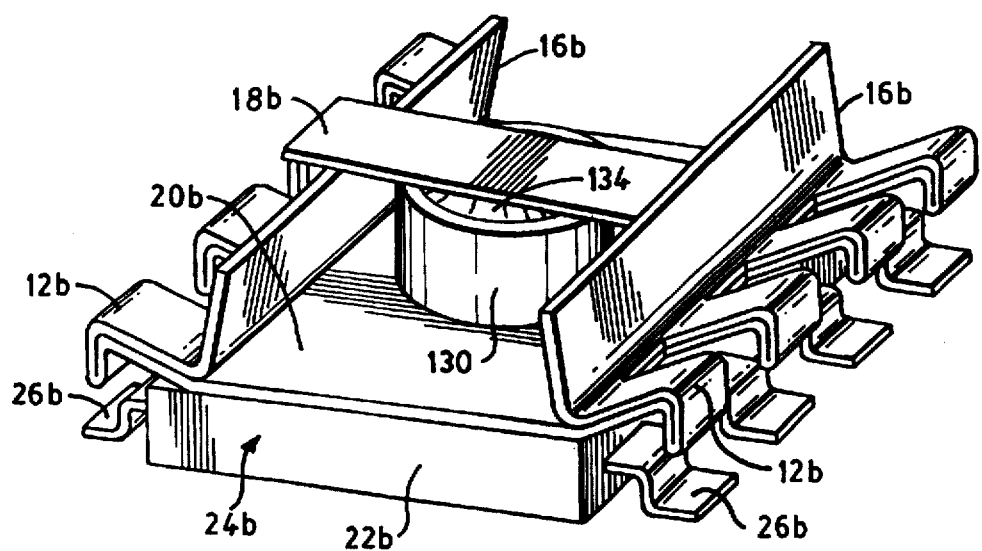
FIG. 3E is a perspective view of an electrostatic discharge protection device-SCP sub-assembly shown in FIG. 3B illustrated in a disconnected position.

Referring now to FIGS. 2A–2C where like numerals designate previously described elements, there is shown a second embodiment of the electrostatic discharge protection device. In contrast to the first embodiment of the electrostatic discharge protection device 10, this electrostatic discharge protection device 38 comprises a metal bar 36 bridging the gap across the horizontal extensions 16a which is not connected to either side of the horizontal extensions 16a. Further, the actuation device comprises a heat sensitive metal block 30 which when subjected to a proper temperature distorts along a vertical axis to distend itself vertically away from the base 14a of the electrostatic discharge protection device 38 thereby pushing the metal bar 36 outward from its initial position between the horizontal extensions 16a. In this embodiment, the bar 36 is connected to the heat sensitive metal block 30 by an adhesive.

The heat sensitive metal block 30) distorts due to a high coefficient of expansion. The high coefficient of expansion is achieved by fabricating the heat sensitive metal block from two metals having substantially different coefficients of expansion. In the preferred embodiment, the heat sensitive metal block is an alloy of aluminum and magnesium. As before, the shorting arms 12a are yieldably biased by built in resilient spring bias so as to urge their respective bottom edge portions against the plurality of connector pins 26a, thereby creating an electrical interconnection between the plurality of shorting arms 12a and the plurality of connector pins 26a. Thus it is readily apparent from FIGS. 2A–2C that before sufficient heat is introduced, the shorting arms 12a urge their respective bottom edge portions against and into respective electrical connection with the plurality of connector pins 26a. In this manner, the shorting of all or some of the plurality of connector pins 26a is accomplished so as to effectively protect the semiconductor die (not shown) within the SCP 24a from electrostatic discharge which could operate to damage the electrical circuitry within the semiconductor die.

As will be readily apparent, the number of connector pins on either interface surface to be shorted together by this electrostatic discharge protection device or any of the other electrostatic discharge protection devices described herein can also be limited to any subset of the conductive pins.

In a similar fashion to that of the first embodiment, the horizontal extensions 16a are biased inward such that movement of the metal bar from the initial positions causes the horizontal extensions to be forced inward at a pivot point directly below the horizontal extensions 16a. The shorting arms 12a are then removed from physical contact with the connecting pins 26a thereby removing the shorting connection across the connecting pins 26a on the SCP 24a.

Also illustrated in this embodiment is a metal clip 32, as previously described, having a wing 34 for physically attaching and securing the electrostatic discharge protection device 38 to the SCP 24a. The metal clip 32 provides the electrostatic discharge protection device 38 with support and stability against lateral movement.

Referring now to FIGS. 3A–3E where like numerals designate previously described elements, there is shown a third embodiment of the electrostatic discharge protection device. This electrostatic discharge protection device 39 comprises a metal bar 18b bridging the gap across the horizontal extensions 16b which is connected to one side of the horizontal extensions 16b, similar to the first embodiment. An actuation device is disposed under the metal bar 18b which comprises a canister 130 containing thermostatic wax 132 covered by a pliable resilient cover 134.

When subjected to a sufficient temperature, the thermostatic wax 132 expands. The canister 130 being substantially rigid forces the thermostatic wax 132 to expand vertically toward the pliable cover 134. The pliable cover 134 distorts vertically contacting the metal bar 18b pushing the metal bar 18b outward from its initial position between the horizontal extensions 16b.

Once the metal bar 36 is pushed beyond a top portion of the horizontal extensions 16b the horizontal extensions are released to conform to the inward bias previously described.

The shorting arms 12b are yieldably biased by means well known in the art such as built in resilient spring bias so as to urge their respective bottom edge portions against the plurality of connector pins 26b, thereby creating an electrical interconnection between the plurality of shorting arms 12b and the plurality of connector pins 26b. Thus it is readily apparent from FIGS. 3A–3E that before sufficient heat is introduced, the shorting arms 12b urge their respective bottom edge portions against and into electrical connection with the plurality of connector pins 26b. In this manner, the shorting of all or some of the plurality of connector pins 26b is accomplished so as to effectively protect the semiconductor die (not shown) within the SCP 24b from the electrostatic discharge which could operate to damage the electrical circuitry within the semiconductor die.

In a similar fashion to that of the first embodiment when the metal bar 44 is moved from its initial position by heat expansion of the thermostatic wax 132 in the canister 130, the horizontal extensions 16b move inward due to the inward bias of the horizontal extensions to be forced inward at a pivot point directly below the horizontal extensions 16b. The shorting arms 12b are then disconnected from physical contact with the connecting pins 26b thereby removing the shorting connection across the connecting pins 26b on the SCP 24b.

Figure 4A:
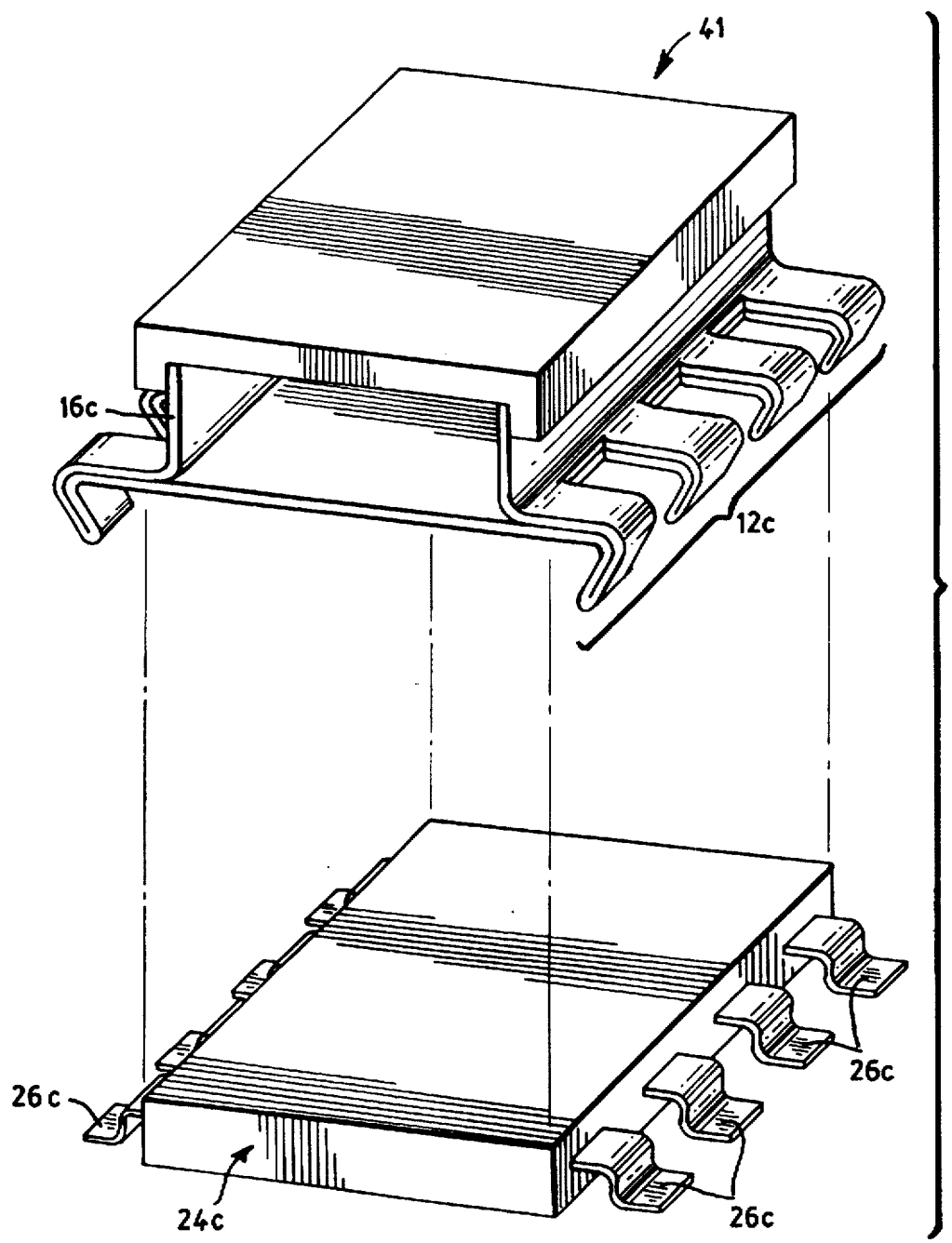
FIG. 4A is an exploded perspective view of an electrostatic discharge protection device of this invention disposed above a SCP.
Figure 4B:
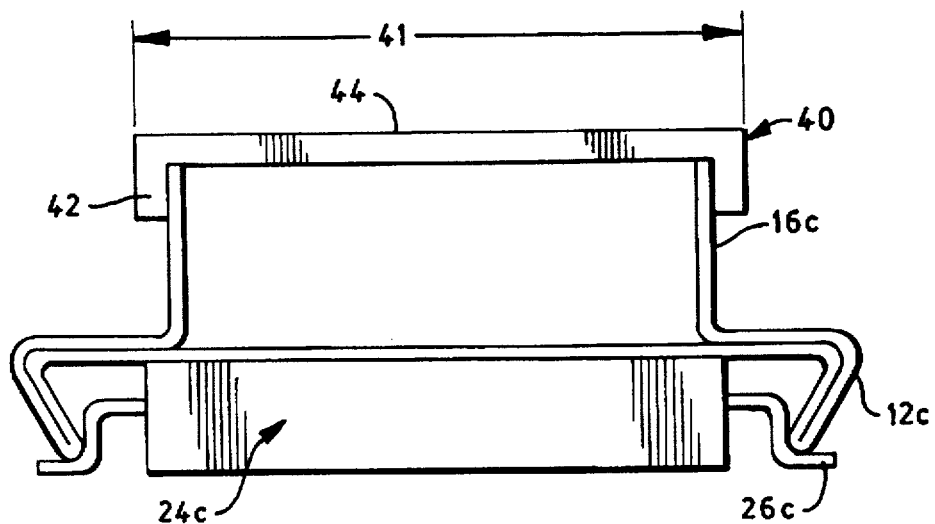
FIG. 4B is a perspective view of the electrostatic discharge protection device shown in FIG. 4A mated to the top surface of the SCP also shown in FIG. 3A.
Figure 4C:
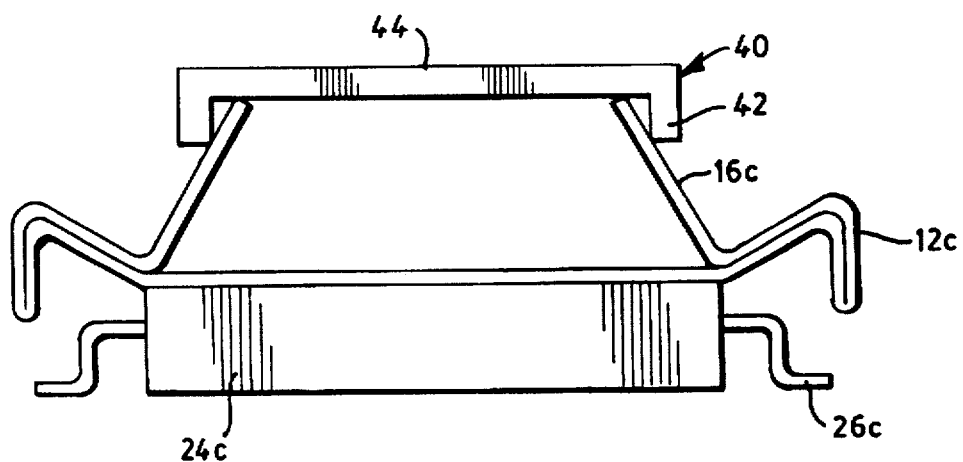
FIG. 4C is a perspective view of an electrostatic discharge protection device-SCP sub-assembly shown in FIG. 4B illustrated in a disconnected position.

Referring now to FIGS. 4A–4C where like numerals designate previously described elements, there is shown a fourth embodiment of the electrostatic discharge protection device. In contrast to the previous embodiments of the electrostatic discharge protection device, this electrostatic discharge protection device 40 comprises a heat sensitive clamp 44 made of conventional heat shrinkable plastic known in the art and bridging the gap between the horizontal extensions 16c. The clamp 44 is actuated when subjected to a proper temperature to constrict along a width 41 of the electrostatic discharge protection device 40 thereby drawing the horizontal extensions 16c inward from their initial position.

The shorting arms 12c are yieldably biased by means well known in the art such as built in resilient spring bias so as to urge their respective bottom edge portions against the plurality of connector pins 26c, thereby creating an electrical interconnection between the plurality of shorting arms 12c and the plurality of connector pins 26c. Thus it is readily apparent from FIGS. 4A–4C that before sufficient heat is introduced, the shorting arms 12c urge their respective bottom edge portions against and into respective electrical connection with the plurality of connector pins 26c. In this manner, the shorting of all or some of the plurality of connector pins 26c is accomplished so as to effectively protect the semiconductor die (not shown) within the SCP 24c from the electrostatic discharge which could operate to damage the electrical circuitry within the semiconductor die.

In contrast to that of the previous embodiments, the horizontal extensions 16c are biased outward toward a normally connected position. Constriction of the clamp 44 from the initial position causes the horizontal extensions 16c to be forced inward at a pivot point directly below the horizontal extensions 16c. The shorting arms 12c are then removed from physical contact with the connecting pins 26c thereby removing the shorting connection across the connecting pins 26c on the SCP 24c.

Figure 5A:
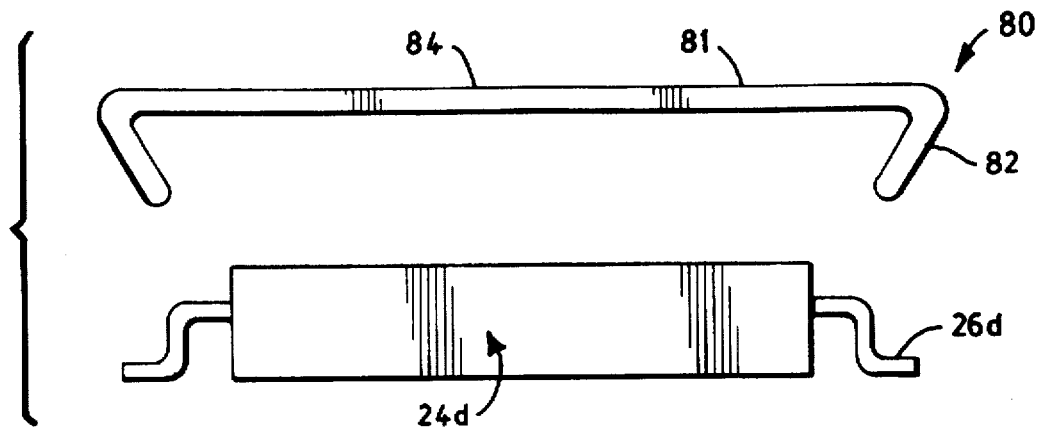
FIG. 5A is an exploded perspective view of an electrostatic discharge protection device of this invention disposed above a SCP.
Figure 5B:
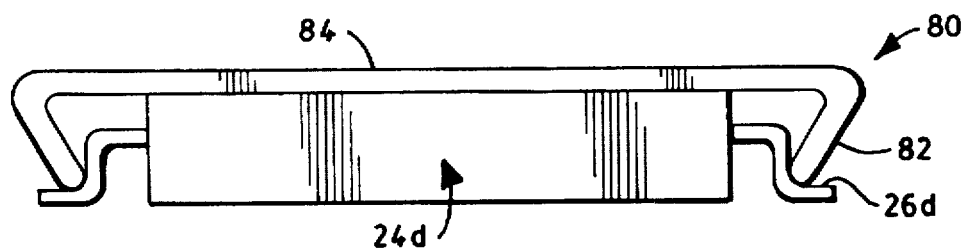
FIG. 5B is a perspective view of the electrostatic discharge protection device shown in FIG. 5A mated to the top surface of the SCP also shown in FIG. 5A.
Figure 5C:
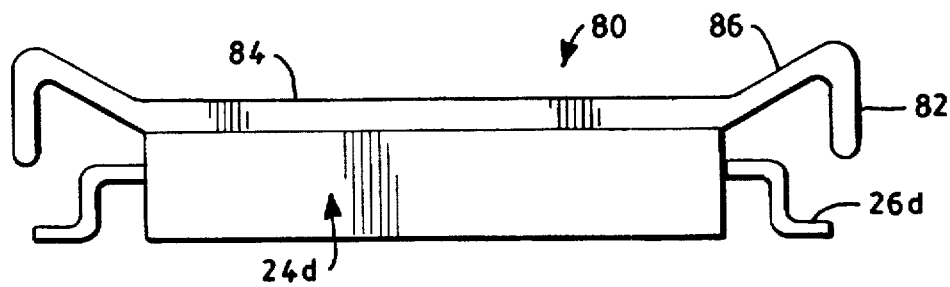
FIG. 5C is a perspective view of an electrostatic discharge protection device-SCP sub-assembly shown in FIG. 5B illustrated in a disconnected position.

Referring now to FIGS. 5A–5C where like numerals designate previously described elements, there is shown a fifth embodiment of the electrostatic discharge protection device 80 for the SCP 24d. The electrostatic discharge protection device 80 in this embodiment, as before, includes a plurality of shorting arms 82 that extend outwardly from a base section 81 in spaced apart relationship with respect to each other and in spaced apart alignment with respect to the plurality of connector pins 26d on the SCP 24d.

The base section 81 of the electrostatic discharge protection device 80 is secured, as before, using any of many methods well known in the art including but not limited to the previously described methods of clips (not shown) and adhesive (not shown). The electrostatic discharge protection device 80 of this embodiment is fabricated from a unidirectionally heat sensitive metal such as NITINOL, a nickel-titanium alloy.

In this embodiment, the shorting arms 82 extend downward from the integral connection with the base section 81 such that a yieldably biased contact with the connector pins 26d is created. Upon introduction of sufficient heat, such as that of soldering, the electrostatic discharge protection device 80 responds by assuming a preprogrammed position. In this embodiment, the preprogrammed position is a bend 86 in the base section, away from the shorting arms and vertically from the surface of the SCP such that the shorting arms 82 are away from the connector pins 26d. The unidirectional nature of this metal ensures that the connection between the shorting arms 82 and the connector pins 26d will not be reestablished upon cooling or removal of the heat source.

In the preprogrammed position with the shorting connection having been withdrawn, the connector pins 26d are electrically isolated.

Figure 6A:
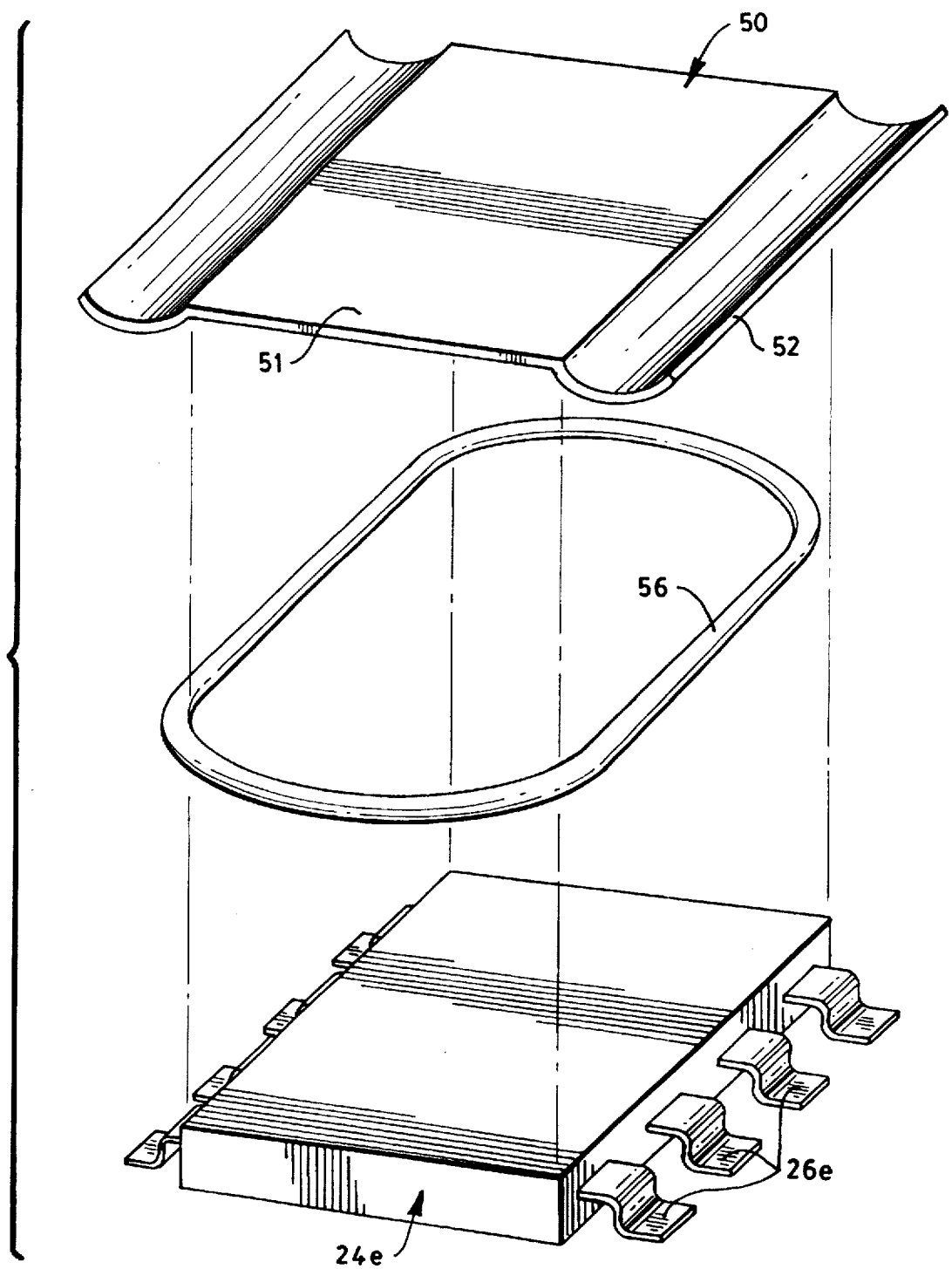
FIG. 6A is an exploded perspective view of an electrostatic discharge protection device of this invention disposed above a SCP.
Figure 6B:
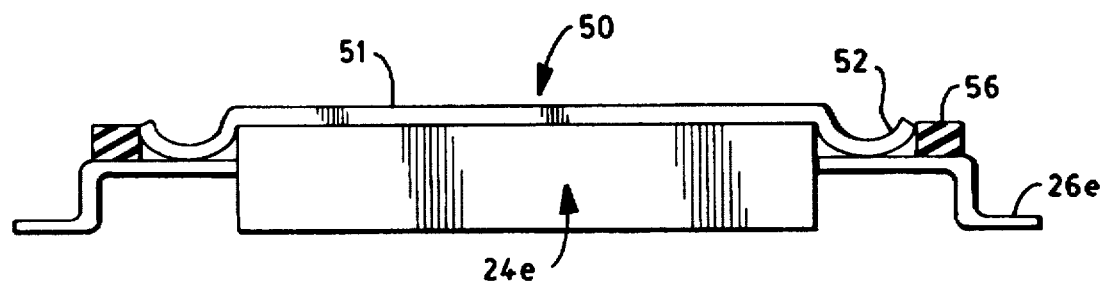
FIG. 6B is a perspective view of the electrostatic discharge protection device shown in FIG. 6A mated to the top surface of the SCP also shown in FIG. 4A.
Figure 6C:
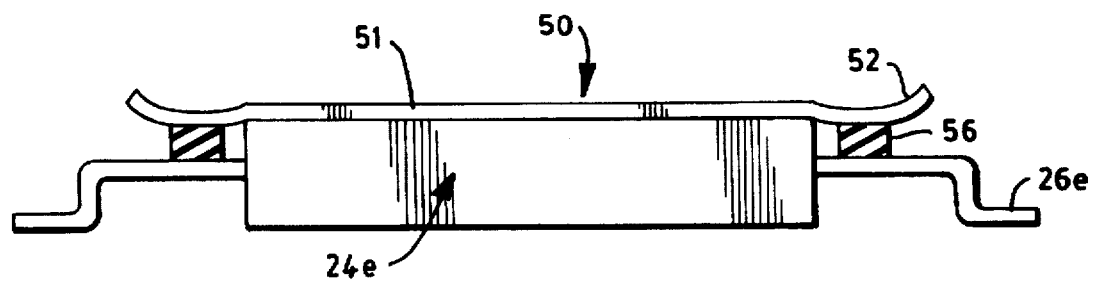
FIG. 6C is a perspective view of an electrostatic discharge protection device-SCP sub-assembly shown in FIG. 6B illustrated in a disconnected position.

Referring now to FIGS. 6A–6C where like numerals designate previously described elements there is shown a sixth embodiment of an electrostatic discharge protection device 50 for the SCP 24e. This embodiment of the electrostatic discharge protection device is similar to the embodiment of FIGS. 4A–4C in that it uses a heat shrinkable structure to break a connection between the connector pins 26e of the SCP 24e and the shorting arms 52 of the electrostatic discharge protection device 50. Like the previous embodiments, this electrostatic discharge protection device 50 comprises a base section 51 and a plurality of shorting, arms 52 which are integral to the base section 51.

The shorting arms 52 in this embodiment of the invention are formed to have an almost flattened 'U' shape with respect to the base section 51. A conventional heat shrinkable, electrically insulative band 56 is then placed around in a contact fit with the outer surface of the 'U' shape of the shorting arms 52 such that it is mechanically held in place. Upon introduction of a proper temperature, often set to be the temperature for soldering, between 600° and 700° Fahrenheit. The insulative band then automatically constricts to slide under the shorting arms 52 thereby forcing the shorting arms contrary to their inherent resilient bias thereby breaking the electrical contact between the shorting arms 52 and the connector pins 26e.

Figure 7A:
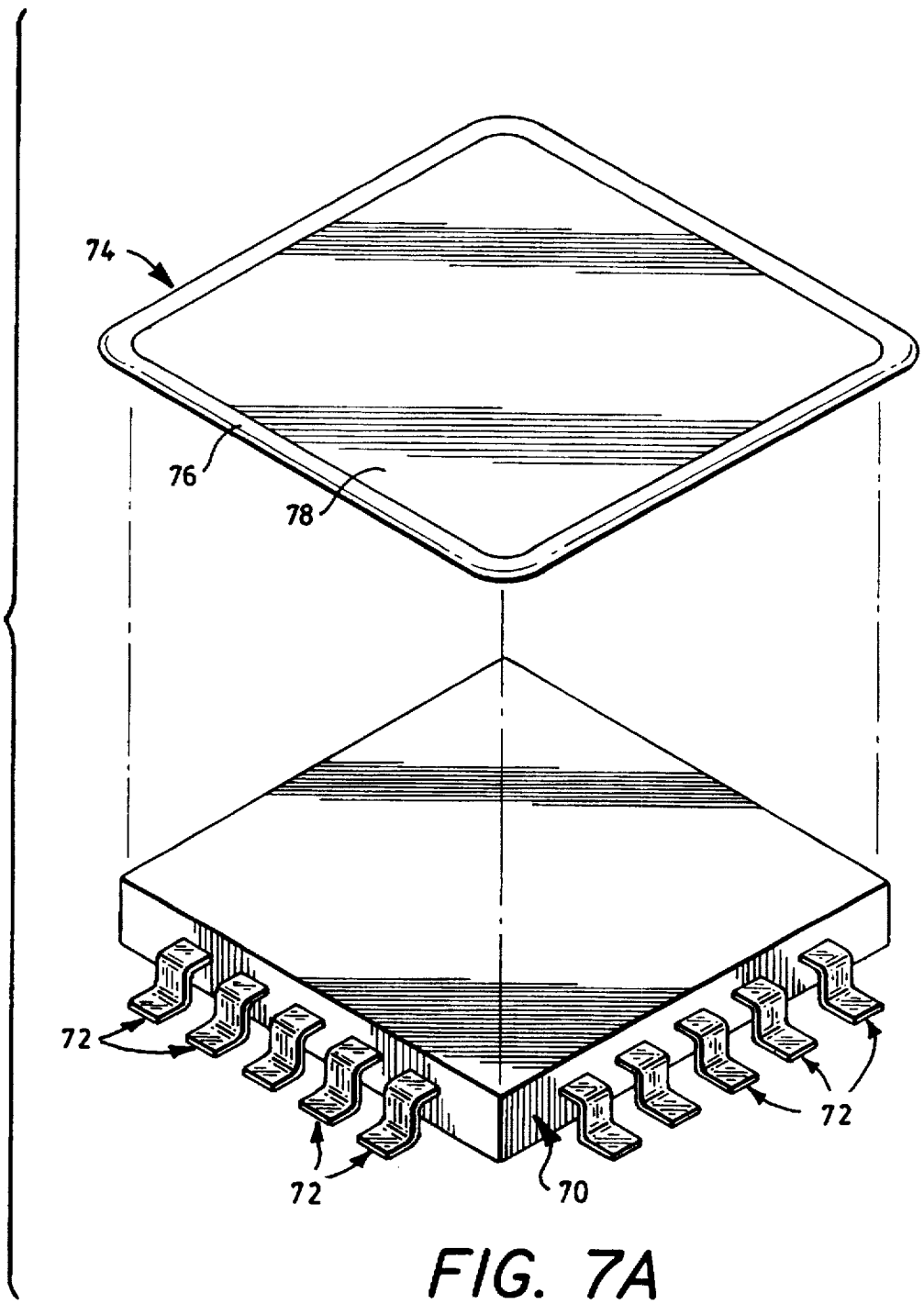
FIG. 7A is an exploded perspective view of an electrostatic discharge protection device of this invention disposed above a SCP.
Figure 7B:
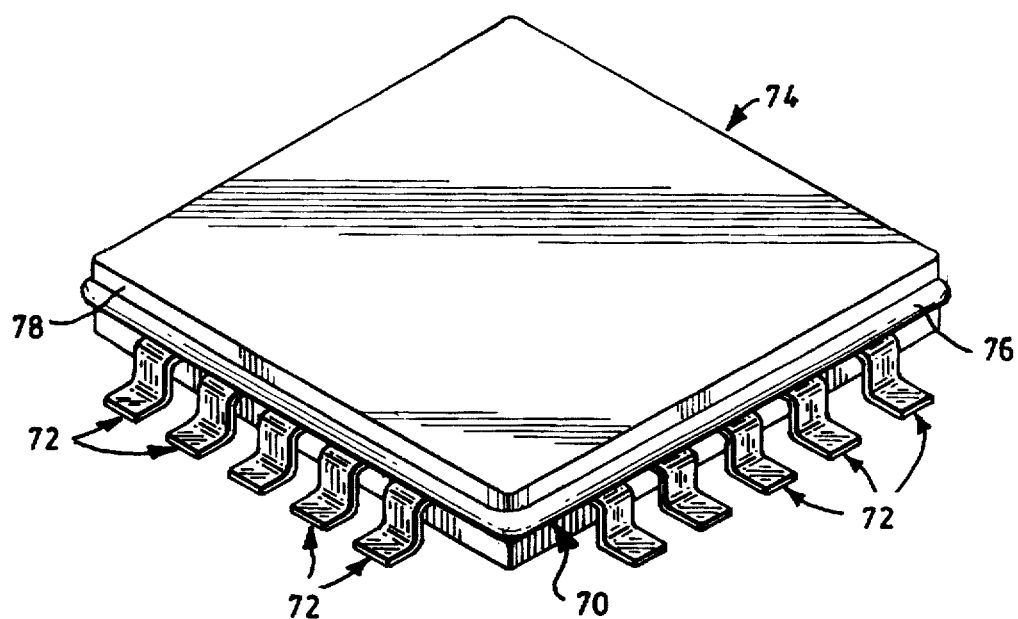
FIG. 7B is a perspective view of the electrostatic discharge protection device shown in FIG. 7A mated to the top surface of the SCP also shown in FIG. 6A.
Figure 7C:
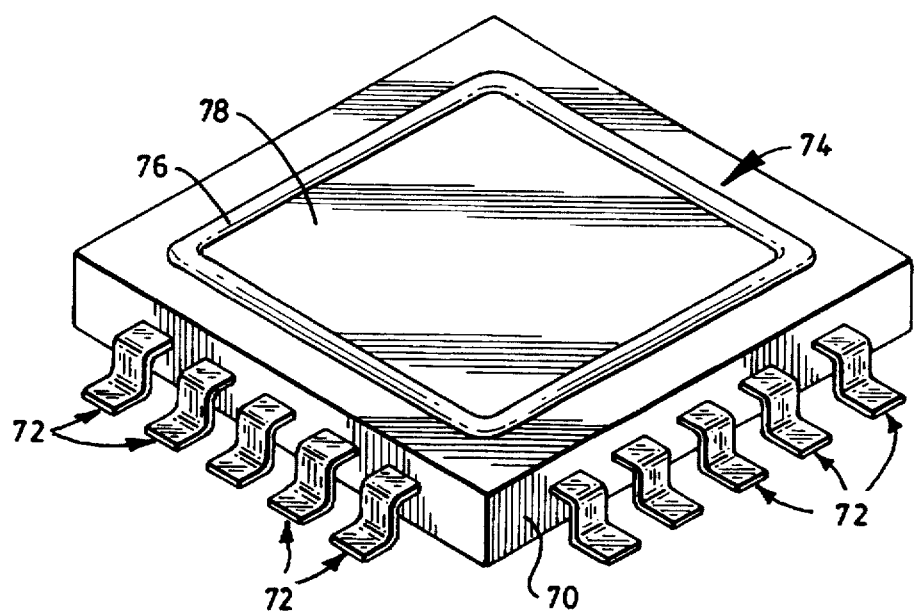
FIG. 7C is a perspective view of an electrostatic discharge protection device-SCP sub-assembly shown in FIG. 7B illustrated in a disconnected position.

Referring now to FIGS. 7A–7C, where like numerals designate previously described elements, there is shown a seventh embodiment of the electrostatic discharge protection device 74 for the SCP 70. This seventh embodiment of the electrostatic discharge protection device utilizes an electrically conductive elastic strip 76. The elastic strip 76 itself is, for example, made of a conventional conductive elastomer, such as rubber, impregnated with or surfaced with electrically conductive metals or other substances such that at least the surface of the elastic strip 76 is electrically conductive.

In this embodiment the elastic strip 76 is connected along its circumference to an electrically neutral film 78 which is heat sensitive such as conventional heat shrinkable film, and secured to the SCP 70 in a center area of the top surface of the SCP 70. Securing the film 78 is accomplished by placing a small amount of adhesive in the center of the film 78 before placing the electrostatic discharge protection device 74 in place.

In practice, the electrostatic discharge protection device 74 is placed over the SCP 70 such that the electrically conductive elastic strip 76 is in physical contact with the connecting arms 72 of the SCP 70 thereby creating a short circuit across a connecting arms 72.

Upon introduction of sufficient heat, the film 78 connecting the conductive elastic strip 76 to the SCP 70 shrinks, drawing the electrically conductive elastic strip 76 inward. This shrinking action forces the elastic strip 76 over the top of the SCP 70 and away from the connector pins 72 such that electrical isolation is reestablished among the connector pins 72.

A further alternative to this embodiment is to replace the film 78 with a weakly adhesive film, such as pressure sensitive adhesives #4268 and #4224 manufactured by 3M Corporation, to allow a user to manually remove the electrostatic discharge protection device when desired.

Figure 8A:
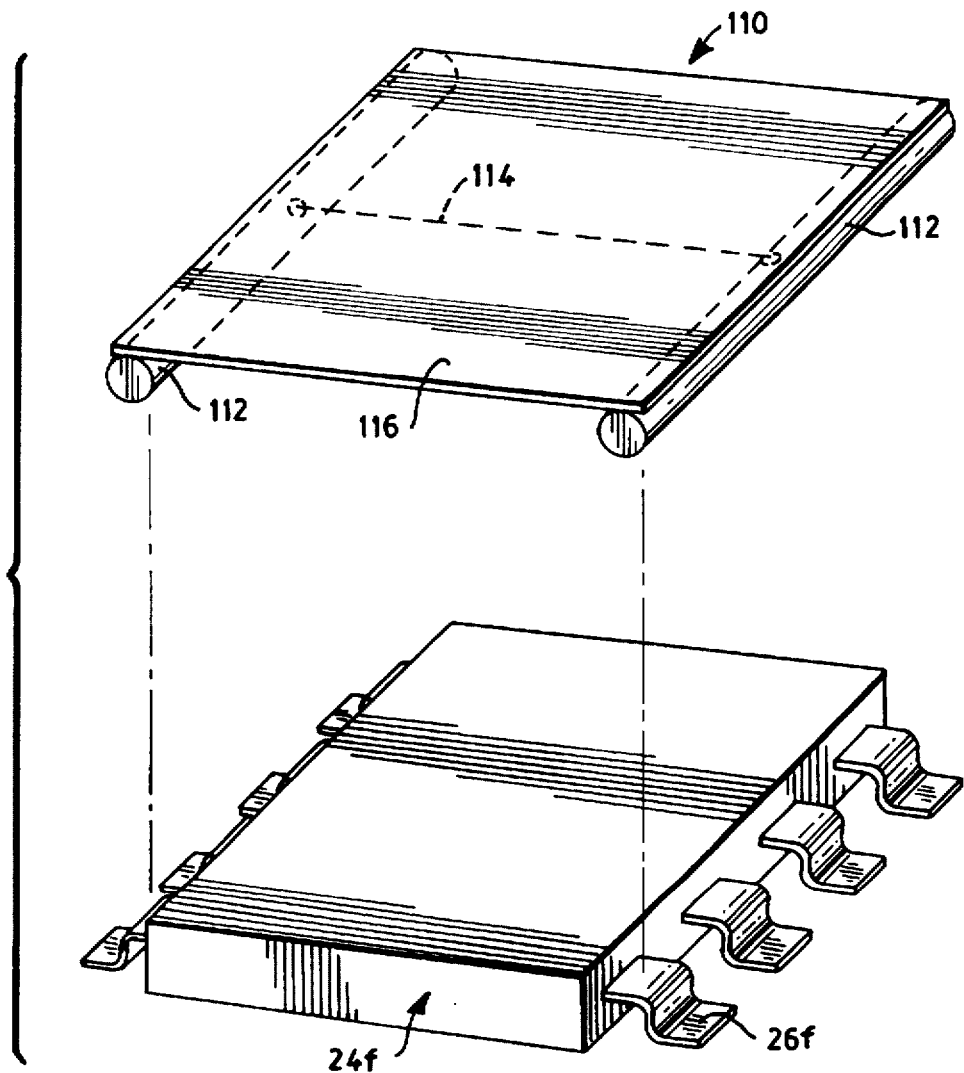
FIG. 8A is an exploded perspective view of an electrostatic discharge protection device of this invention disposed above a SCP.
Figure 8B:
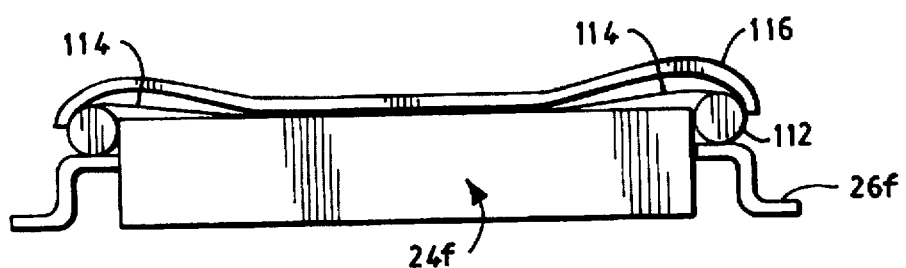
FIG. 8B is a perspective view of the electrostatic discharge protection device shown in FIG. 8A mated to the top surface of the SCP also shown in FIG. 8A.
Figure 8C:
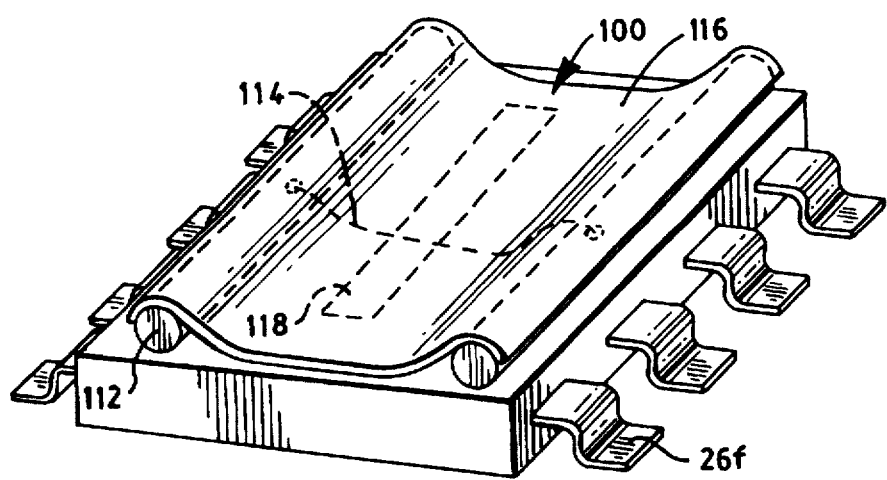
FIG. 8C is a perspective view of an electrostatic discharge protection device-SCP sub-assembly shown in FIG. 8B illustrated in a disconnected position.

Referring now to FIGS. 8A–8C, where like numerals designate previously described elements, there is shown another embodiment of the electrostatic discharge protection device 110 for the SCP 24f. This embodiment of the electrostatic discharge protection device 110 utilizes pliable conductive bars 112, such as a product sold under the name FUZZ BUTTON, manufactured by Technical Wire Products, Inc. of New Jersey, in place of shorting arms. The pliable conductive bars are electrically conductive and are ductile so as to conform to any spatial or angular inconsistencies among the connector pins 26f. The pliable conductive bars 112 lie on top of the connector pins 26f of the SCP 24f such that all the connector pins 26f are shorted together.

The pliable conductive bars 112 are connected together with a thin wire 114 which is preferably resilient. In the preferred embodiment, the wire is fabricated from gold plated beryllium copper. The wire allows electrical conduction from all connecting arms to the grounding pin on the SCP 24f The pliable conductive bars 112 are biased into physical contact with the connector pins 26f by heat sensitive plastic 116 which connects each of the pliable conductive bars 112 and is secured to the SCP 24f. In the preferred embodiment, the heat sensitive plastic 116 is formed in a tubular arrangement and is then sliced axially to ensure the inward bias.

Upon introduction of sufficient heat, the heat sensitive plastic 116 shrinks around an adhesive connection 118 to the SCP 24f, drawing the heat sensitive plastic 116 inward. This shrinking action forces the pliable conductive bars 112 over the top of the SCP 24f and away from the connector pins 26f such that electrical isolation is reestablished among the connector pins 26f.

Figure 9A:
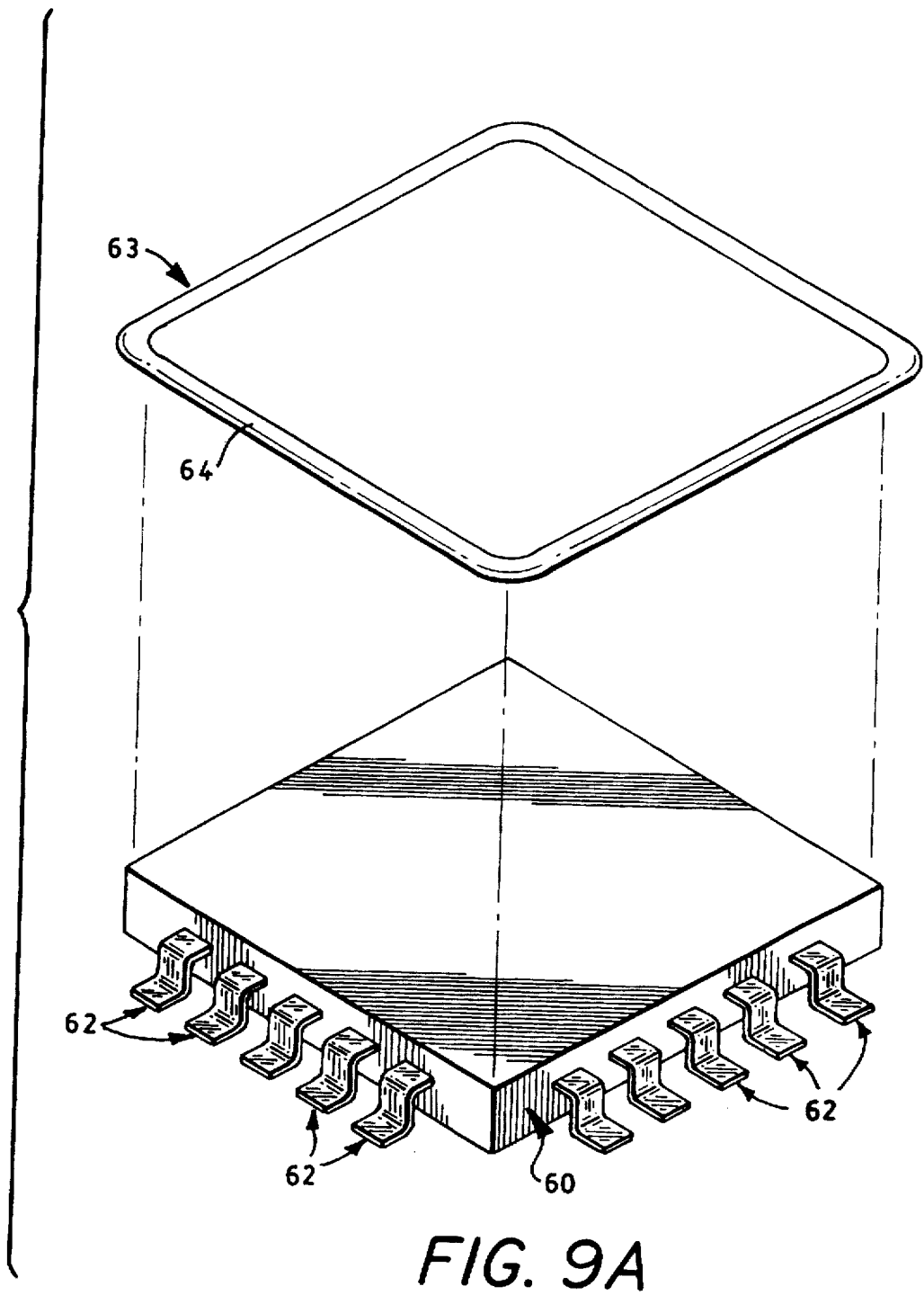
FIG. 9A is an exploded perspective view of an electrostatic discharge protection device of this invention disposed above a SCP.
Figure 9B:
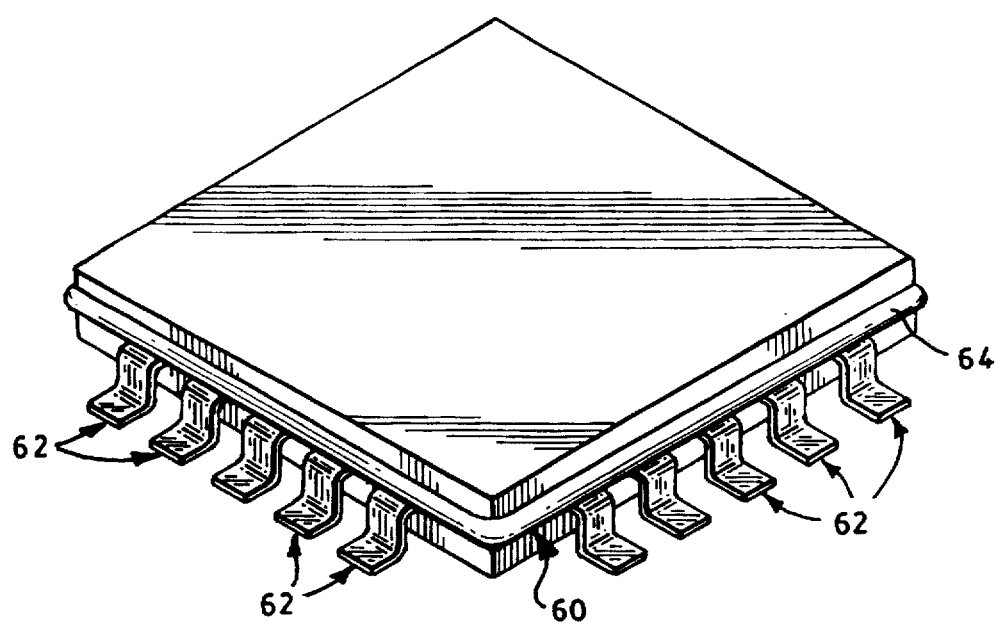
FIG. 9B is a perspective view of the electrostatic discharge protection device shown in FIG. 9A mated to the top surface of the SCP also shown in FIG. 9A.

Referring now to FIGS. 9A–9B there is shown another SCP-electrostatic discharge protection device combination of this invention comprising an SCP 60 with connector pins 62 in spaced apart relationship to each other. In this embodiment of the invention, an electrostatic discharge protection device 63 comprises an electrically conductive rubber band 64, such as that described in a previous embodiment, which is placed around a perimeter of the SCP 60 such that the rubber band 64 is in physical contact with the connector pins 62 of the SCP 60. In this way an electrical short circuit is placed across the connector pins 62 thereby grounding unwanted electrostatic discharge. The electrically conductive rubber band 64 of the electrostatic discharge protection device 63 at any point in the manufacturing process can be manually removed by a user simply by gripping the electrostatic discharge protection device 63 and pulling the electrostatic discharge protection device 63 over the top surface of the SCP 60. The electrostatic discharge protection device 64 is held in position by elastic force within the conductive rubber band 64 which is drawing itself towards the lateral surfaces of the SCP 60.

A further option in this embodiment is to replace the conductive rubber band 64 with a flexible conductive adhesive bead. The adhesive bead is placed on the connector pins 62 of the SCP 60 and the electrostatic discharge protection device in a uniform continuous bead. The adhesive helps keep electrical contact across a span of the connector pins 62 but is weak enough to allow a user to remove the electrostatic discharge protection device when desired. In this embodiment, the adhesive used is TRA-DUCT 2916, a trademark owned by Tracon Inc., of Medford, Mass.

The invention may be embodied in other specific forms without departing from the spirit or other essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

I claim:

1. An electrostatic discharge protection device for use with a semiconductor chip package of a type having an upper surface with depending lateral sides and a plurality of connector leads extending from the lateral sides, said electrostatic discharge protection device comprising:

a base section suitable for attachment to the package upper surface;

grounding means extending from said base section, said grounding means having an operative position in which said grounding means are placed into electrical contact with the connector leads so as to provide a shunt across the leads, and an inoperative position in which said shunt is removed from the connector leads; and constriction means emplaced against said grounding means such that a rise in temperature will cause a decrease in size of said constriction means and act to move said grounding means from said operative position to said inoperative position.

2. The electrostatic discharge protection device of claim 1 wherein said grounding means comprises at least two extensions extending in a direction from the package surface, and said constriction means engages said extensions such that the rise in temperature acts to move said extensions inward from their initial positions, thus placing said grounding means into said inoperative position.

3. The electrostatic discharge protection device of claim 1 wherein said constriction means comprises an electrically-insulative band which extends around the perimeter of said grounding means.

4. The electrostatic discharge protection device of claim 1 wherein said grounding means comprises an electrically-conductive band which extends around the semiconductor package.

5. The electrostatic discharge protection device of claim 4 wherein said constriction means comprises heat shrinkable means attached to said conductive band for removing said conductive band from the connector leads with the rise in temperature.

6. The electrostatic discharge protection device of claim 1 wherein said grounding means comprises two or more resilient conductive bars biased into electrical contact with the connector leads.

7. The electrostatic discharge protection device of claim 6 wherein said constriction means comprises heat shrinkable means attached to said conductive bars for drawing away said conductive bars from the connector leads with the rise in temperature.

8. The electrostatic discharge protection device of claim 6 further comprising an electrical conductor electrically connecting said conductive bars.

* * * * *